US 6,623,997 B2

United States Patent
Chang et al.

(10) Patent No.: US 6,623,997 B2
(45) Date of Patent: Sep. 23, 2003

(54) METHOD FOR BURN-IN PROCESSING OF OPTICAL TRANSMITTER ARRAYS USING A SUBMOUNT SUBSTRATE

(75) Inventors: James Chang, Cupertino, CA (US); Ronald T. Kaneshiro, Mountain View, CA (US); Stefano G. Therisod, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 260 days.

(21) Appl. No.: 09/738,827

(22) Filed: Dec. 15, 2000

(65) Prior Publication Data

US 2002/0076841 A1 Jun. 20, 2002

(51) Int. Cl.[7] .......................... H01L 21/66; G01R 31/26
(52) U.S. Cl. .......................... 438/18; 438/128; 438/129; 438/14; 438/17; 438/5; 438/10; 438/11; 438/12
(58) Field of Search ................................. 438/128, 129, 438/130, 68, 69, 458, 464, 14, 17, 18, 5, 10, 11, 12

(56) References Cited

U.S. PATENT DOCUMENTS 5,493,577 A * 2/1996 Choquette et al. ............ 372/46
5,617,036 A * 4/1997 Roff ........................... 324/760

* cited by examiner

Primary Examiner—Amir Zarabian
Assistant Examiner—Khanh Duong

(57) ABSTRACT

A submount substrate is used for the dual purposes of enabling simultaneous burn-in processing for a relatively large number of arrays of optical transmitters and enabling conventional dicing techniques to be used to form mounting-ready assemblies. In the preferred embodiment, the submount substrate is a silicon wafer that is specifically designed to provide connectivity between VCSEL arrays and burn-in equipment during the testing stage, but is also designed to be segmented and used in the final packaging stage. Because the submount is a silicon wafer, conventional integrated circuit fabrication techniques may be used to form conductive patterns that define array-receiving areas and that allow external circuitry to communicate with the various VCSEL arrays.

16 Claims, 7 Drawing Sheets

METHOD FOR BURN-IN PROCESSING OF OPTICAL TRANSMITTER ARRAYS USING A SUBMOUNT SUBSTRATE

TECHNICAL FIELD

The invention relates generally to optical devices and more particularly to a method for performing burn-in processing of optical transmitters.

BACKGROUND ART

Increasingly, data communications involve transmissions by optical sources that can deliver tremendous volumes of digitized information as pulses of light. This is especially true for many communication companies that utilize laser diodes and optical fibers as their primary means for the transmission of voice, television and data signals for ground-based communications networks.

To achieve high bandwidth, laser diodes such as edge-emitting lasers and Vertical Cavity Surface Emitting Lasers (VCSELs) are commonly utilized as optical sources. These types of laser diodes are preferred due to their minute dimensions. For example, the typical VCSEL is measured in the order of micrometers. Consequently, an array of laser diodes can be integrated into a system to achieve high bandwidth transmissions.

In the manufacturing and production of VCSEL arrays, such as 1×12 or 1×4 parallel channel optical arrays, it is critical that arrays that are subsequently utilized manifest target optical and electrical characteristics. To determine whether the VCSEL arrays will be operating at their target levels, it is necessary to subject each diode of the array to a burn-in process. That is, each VCSEL must be submitted to a rigorous quality control (QC) procedure that includes subjecting the VCSEL to a constant current at an elevated temperature for an extended time period. The burn-in current can be selected to be at a level that is higher than the standard operating current, since the QC procedure is a short-term test of whether the VCSELs will provide long-term performance during actual operating conditions. Similarly, the burn-in temperature is selected to be at a higher temperature than the anticipated operating temperature. Finally, the burn-in time period is selected on the basis of the type, specification and stringency of the devices.

Currently, the burn-in process for VCSELs is largely performed at the packaging level. That is, quality control is performed on an individual VCSEL array after the VCSEL array has been die attached and wire bonded in package form. In fact, burn-in is sometimes executed until the array has been connected to a nearly finished product having electrical circuitry, such as a feedback circuit. If any VCSEL within the array is determined to be defective or is not in compliance with the specifications as required following a burn-in process, the entire assembly is discarded. This is wasteful and expensive in terms of material, use of fabrication resources, and labor costs.

Consequently, what is needed is an efficient burn-in process that allows the burn-in testing of optical arrays in such a manner as to verify that each optical transmitter is capable of operating at its target performance level prior to the packaging level.

SUMMARY OF THE INVENTION

A submount substrate is used while in an intact condition for its original purpose of enabling simultaneous burn-in processing for a number of arrays of optical transmitters, and is used in a segmented condition for its secondary purpose of providing a means for connecting individualized arrays to other electrical components of devices in which the arrays are to operate. That is, the submount substrate is specifically designed to provide connectivity between the arrays and burn-in equipment during the testing stage, but is also designed to be segmented and used in the final packaging stage.

The arrays of optical transmitters may be fabricated using known techniques. In the preferred embodiment, the optical transmitters are laser diodes and are most preferably Vertical Cavity Surface Emitting Lasers (VCSELs). VCSELs are formed using integrated circuit fabrication techniques. VCSELs include a number of patterned layers that cooperate to emit light when connected to a drive current. As one example, each VCSEL array may be a side-by-side arrangement of twelve VCSELs to be used in a 1×12 parallel channel optical transmitter or transceiver module. In accordance with the invention, the arrays of laser diodes are conventionally fabricated on a semiconductor substrate that is then diced to form the individual arrays. While not critical to the invention, some testing of the laser diodes may be performed prior to the dicing step.

After the arrays of laser diodes have been fabricated and separated into discrete chips, the arrays are mechanically and electrically coupled to the submount substrate. In the preferred embodiment, the submount substrate is a semiconductor substrate and is most preferably a silicon wafer. Thus, conventional integrated circuit fabrication techniques may be used to form contact patterns along one surface of the submount substrate. The contact patterns provide a repeating arrangement of array-receiving areas. The transmitter arrays are connected to the submount substrate at the array-receiving areas. Wire bonding and/or flip chip techniques may be employed in connecting the transmitter arrays to the submount substrate.

In addition to the contact patterns, the submount substrate includes electrical paths. The electrical paths provide connections between the burn-in equipment and the individual laser diodes of the arrays. In the preferred embodiment, the submount substrate is a silicon wafer having a matrix of the contact patterns in a central region and having probe contact pads on a peripheral region. The probe contact pads are used to connect the silicon wafer to other circuitry, such as burn-in control circuitry on a printed circuit board. Also in the preferred embodiment, the silicon substrate includes integrated resistors, with each laser diode having at least one dedicated resistor for properly biasing the laser diode. Preferably, the voltage drop across the dedicated resistor is monitored and is used as a feedback mechanism for maintaining the laser diodes at the burn-in current that is selected for the burn-in process.

The burn-in process may involve a rigorous procedure in which the laser diodes are operated at the burn-in current for an extended period of time and at an elevated temperature. For example, the temperature may be maintained within the range of 80° C.–120° C. and the burn-in time may be in the range of 24 hours to 72 hours. The burn-in current is selected to have an amperage that is slightly below the overdrive current, which is the maximum current at which the laser diode can reliably function without sustaining performance degradation or failure. As one example, a VCSEL may have a burn-in current of approximately 30 milliamperes.

Following the completion of the burn-in period, each laser diode of each array is tested. In the preferred embodiment, the testing occurs while the submount substrate is still intact. Each laser diode is probed to determine its operational state. Those arrays that have at least one laser diode that is detected as being non-operational are identified as defective. The submount substrate is then diced into segments in which each segment is an assembly of an array chip mounted on a submount chip. The assemblies having identified defective arrays are discarded, while the remaining assemblies are used for manufacturing optical devices, such as transmitter modules and transceiver modules. In the preferred embodiment, the connection of the assembly to another component of an optical device is achieved by wire bonding from the array chip. Thus, the submount chip provides the mechanical connection, while electrical connections are made directly to the array chip.

DETAILED DESCRIPTION

Figure 1:
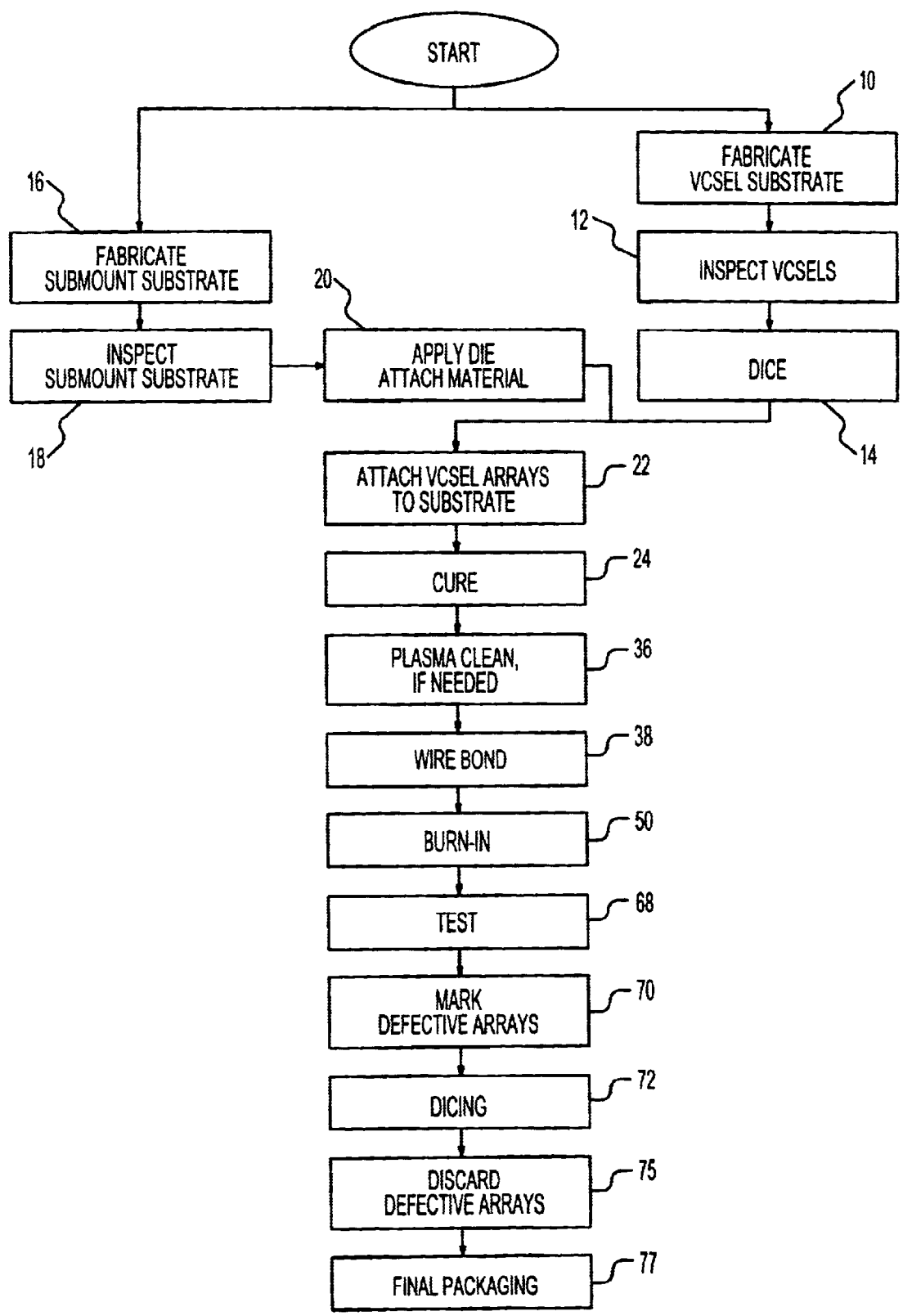
FIG. 1 is a process flow of steps for implementing a manufacturing method in accordance with the invention.

With reference to FIG. 1, process steps are shown for performing a burn-in of arrays of optical transmitters. In the preferred embodiment, the optical transmitters are laser diodes. The description of the process will identify the optical transmitters as VCSELs, which is the most preferred embodiment.

At step 10, VCSELs are fabricated on a substrate. As is well known in the art, VCSELs are layers of materials that cooperate to generate light when exposed to drive current. The VCSEL substrate is a semiconductor substrate, such as a gallium arsenide wafer. The VCSELs are formed in arrays. As one example, an array may be a 1×12 arrangement for use in a twelve-channel parallel VCSEL array. Other conventional arrays include 4×4 arrangements.

Step 12 involves VCSEL inspection. The complexity of this step is not critical to the invention. Some testing may occur while the VCSEL substrate is still intact. However, the burn-in conditions are not established while the VCSEL substrate is intact.

The VCSEL substrate is diced at step 14. As with steps 10 and 12, this is a conventional step that is followed in the manufacture of VCSEL packages. Well known dicing techniques may be implemented.

On the other hand, step 16 is unconventional. A submount substrate is fabricated to include a matrix of array-receiving areas and to include electrical paths to a periphery of the submount substrate. In the preferred embodiment, the submount substrate is formed of a semiconductor. In the most preferred embodiment, the substrate is a silicon wafer. Features that are formed in the fabrication of the submount substrate will be described in greater detail when referring to FIGS. 2, 3 and 4.

At step 18 of FIG. 1, the fabricated submount substrate is inspected. The inspection techniques are not critical to the invention. Either or both of visual and electrical inspection techniques may be employed.

Die-attach material is applied to the submount substrate at step 20. The selection of the material depends upon the selected techniques for attaching VCSEL arrays (available after step 12) to the submount substrate that is inspected at step 18. The die-attach material may be limited to providing physical connection. For example, a bonding material may be applied within regions defined by the array-receiving areas fabricating along the submount substrate. Alternatively or additionally, solder bumps may be formed that enable the VCSEL arrays to be attached using flip chip techniques.

In step 22, the VCSEL arrays from step 12 are mechanically and electrically attached to the submount substrate. The techniques for attaching the VCSEL arrays are consistent with the application of the die-attach materials at step 20. As one example of the attaching techniques, the VCSEL arrays are mechanically attached to the submount substrate using a bonding material and are electrically connected using wire bonding techniques. Gold wire bonds may be conventionally applied at a subsequent step 38. The bonding material is then cured at step 24.

Figure 2:
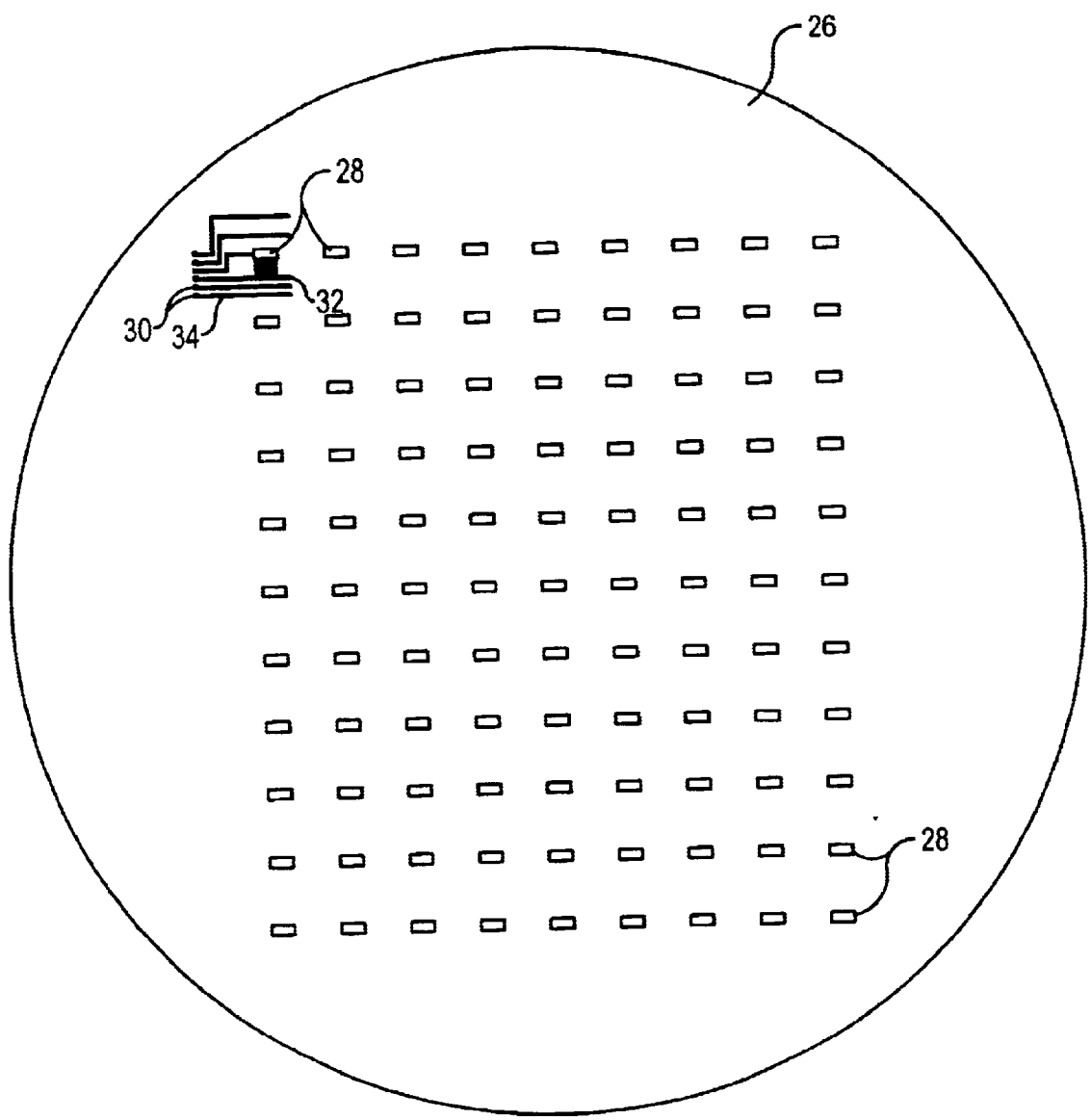
FIG. 2 is a top view of a silicon substrate having a matrix of arrays of laser diodes in accordance with one embodiment of the invention.
Figure 3:
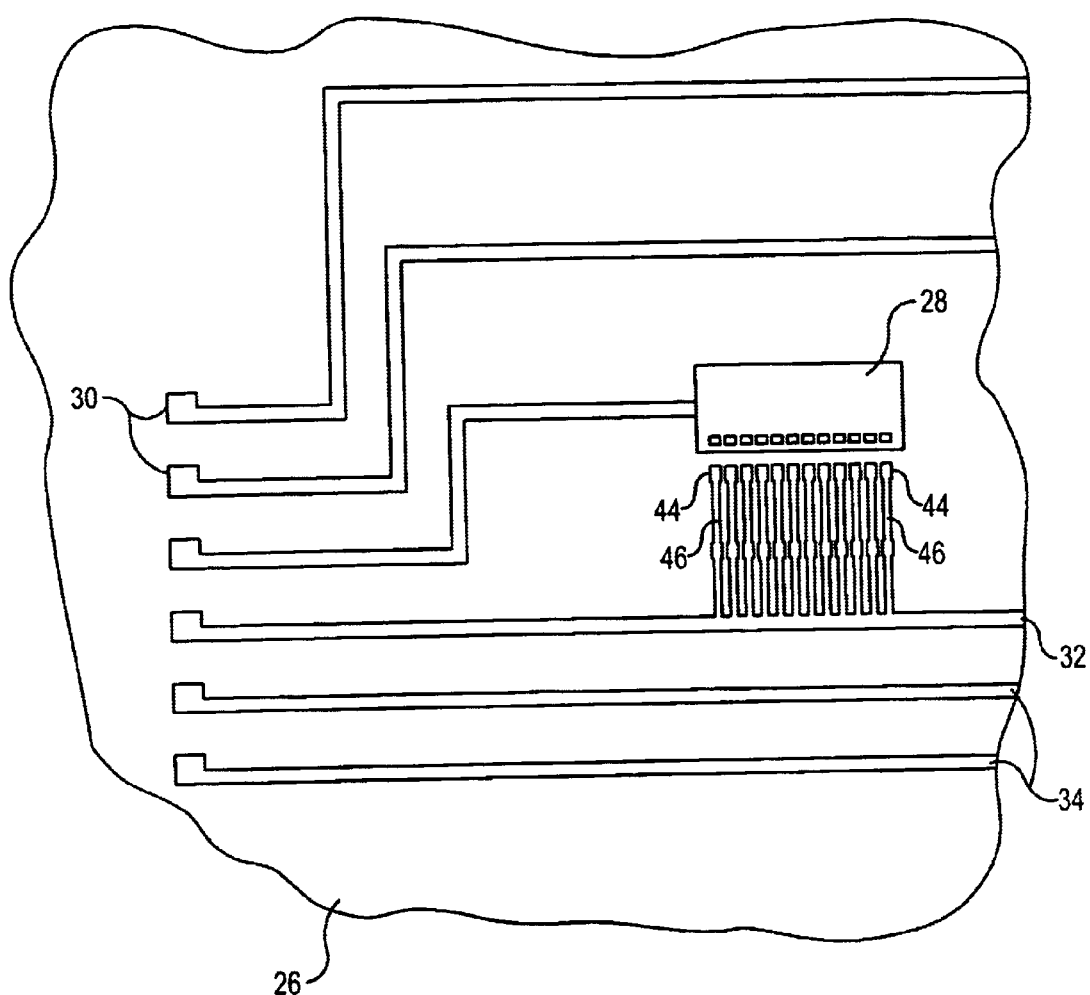
FIG. 3 is a top view of a portion of the silicon substrate of FIG. 2 having one array of laser diodes and having conductive traces.

FIG. 2 illustrates one possible embodiment of the assembly that will be provided after the completion of the attaching and curing steps 22 and 24 of FIG. 1. FIG. 2 is a top view of a silicon submount 26 that is included merely for example. In this example, the silicon submount has a total of ninety-nine VCSEL arrays 28. The VCSEL arrays are arranged in a matrix of nine columns and eleven rows. In one embodiment, the silicon substrate is a six inch (152.4 millimeter) silicon wafer. The pitch of the VCSEL arrays in a column may be 10 millimeters. Similarly, the pitch of the VCSEL arrays in a row may be 10 millimeters. However, other arrangements are possible.

For the purpose of clarity, only the electrical connections to the VCSEL array 28 in the upper left hand corner of the matrix array are illustrated. The same electrical connections are shown in greater detail in FIG. 3. Electrical paths extend from the periphery of the silicon substrate 26. The electrical paths begin at bond pads 30. The bond pads 30 are used to provide connection to external circuitry, such as current control and feedback circuitry. The bond pads are used in the burn-in process and in the subsequent testing of individual VCSELs. Connections to the bond pads may involve known die-attach techniques or known flip-chip techniques. A bond pad 30 may have a square configuration with sides of 0.5 millimeters.

The bond pads 30 are integrated with conductive traces, such as traces 32 and 34. The traces are patterned metal layers that are fabricated using conventional techniques. While not critical, the pitch of the electrical traces may be 1.25 millimeters and the side-to-side dimension of a particular trace may be 0.25 millimeters. As will be explained more fully below, the conductive trace 32 is preferably divided into a number of separate traces, so that each VCSEL in the array 28 can be individually driven.

Figure 4:
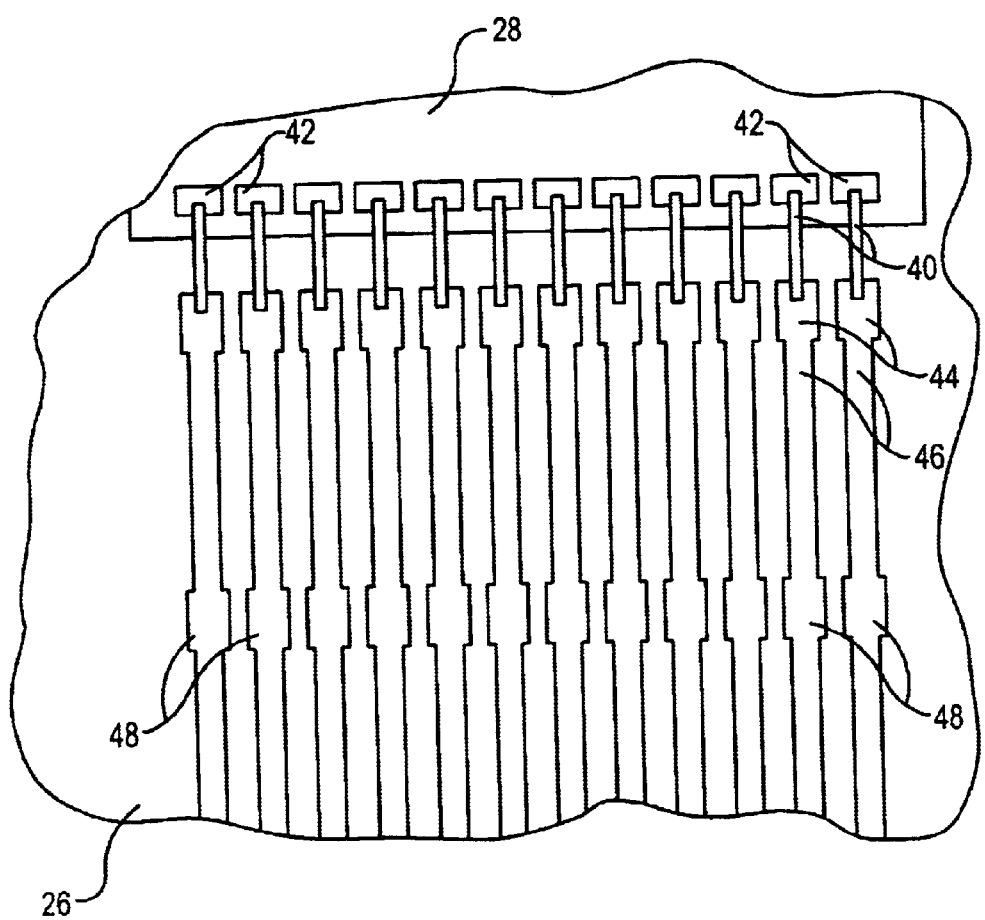
FIG. 4 is a top view of the connections of conductive traces on the silicon substrate to contact pads on the array of laser diodes.

Returning to FIG. 1, the assembly of FIG. 2 is plasma cleaned at step 36, If necessary. The individual VCSEL arrays 28 are then wire bonded at step 38 to contact pads which define the array-receiving areas of the silicon substrate. FIG. 4 illustrates the VCSEL array 28 of FIG. 3 as having bond pads 42 that are connected to gold bond wires 40. The opposite ends of the bond wires are attached to bond pads 44 of the silicon submount 26. Traces 46 extend from the submount bond pads 44 to peripheral bond pads. In the preferred embodiment, the individual VCSELs of the array 28 can be controlled. Thus, the traces 46 are connected separately to control circuitry in this preferred embodiment. Also in the preferred embodiment, each VCSEL is uniquely associated with a particular resistor. The resistors are represented by the expanded regions 48 in FIG. 4. These expanded regions may be formed of resistive material, so that the resistors are integrated onto the silicon submount 26. Alternatively, the traces 46 may have areas of reduced width, so that the "resistors" may be formed without a change in the use of the materials that are used to form the traces. In this reduced-width embodiment, the areas 48 may be bond pads that are used in final packaging after the silicon submount 26 has been diced.

Figure 5:
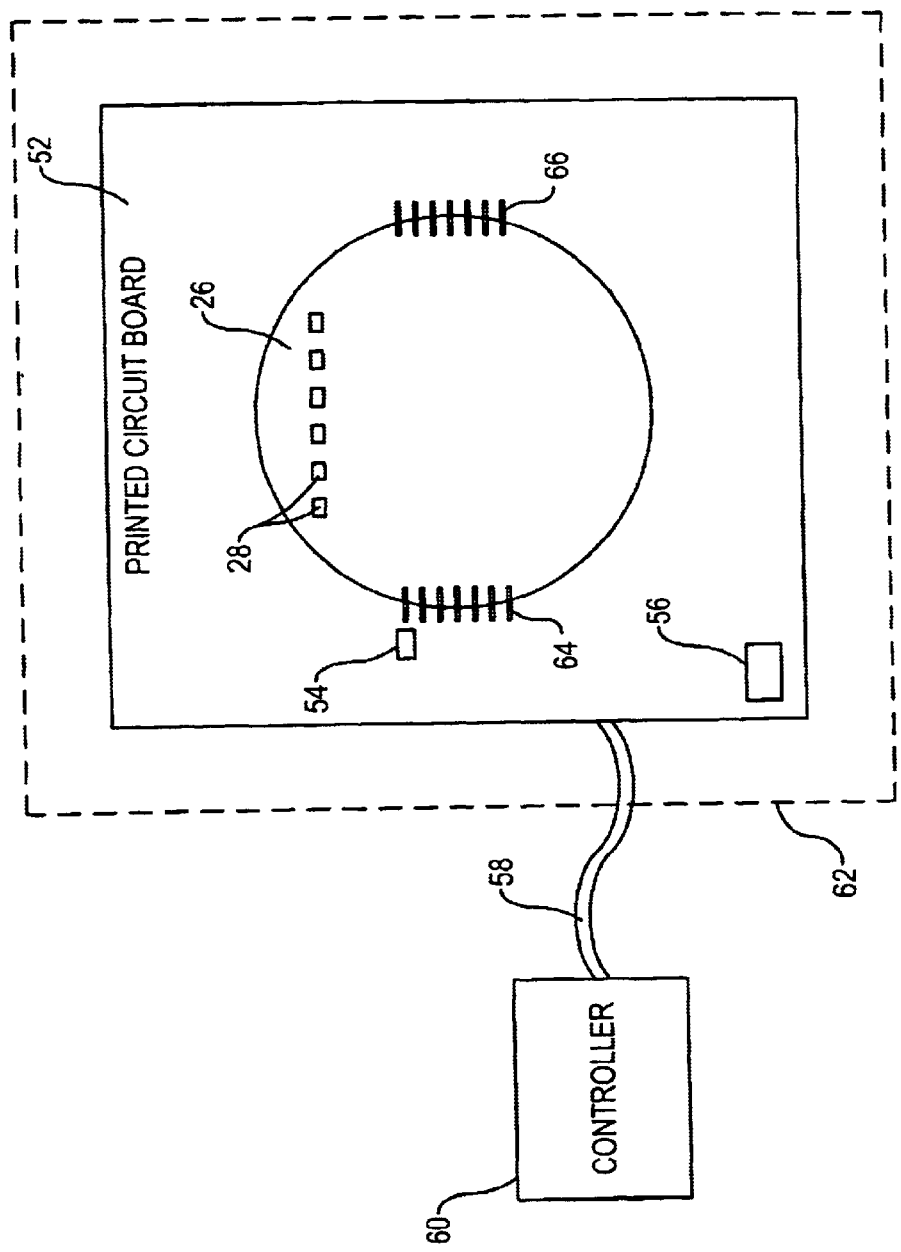
FIG. 5 is a schematic illustration of a burn-in arrangement.

The next step 50 in FIG. 1 is to perform the burn-in process. Each VCSEL in each array 28 of FIG. 2 is subjected to a procedure in which the current, temperature and time constants are tightly controlled. Typically, the burn-in process is performed at a constant current that is slightly below the overdrive current of the particular VCSEL. Moreover, the surrounding temperature is elevated. For example, the temperature may be held in the range of 80° to 120° C. The burn-in time period can range between 24 hours and 72 hours, but this is not critical. Often, the burn-in current is held one percent below the overdrive current of the particular VCSEL. Referring now to FIG. 5, the silicon submount 26 having the matrix of VCSEL arrays 28 is shown as being connected to a printed circuit board 52. The printed circuit board includes components such as a monitoring chip 54 and a test chip 56. A ribbon cable 58 may be used to connect the printed circuit board to a controller 60. The dashed lines 62 surrounding the printed circuit board 52 indicate that the printed circuit board and silicon submount 26 are housed within an oven, while the controller remains at the exterior of the oven.

The VCSEL arrays 28 and any circuitry contained on the silicon submount 26 communicate with the printed circuit board via bond wires 64 and 66. Alternatively, the silicon submount may be connected using flip chip techniques or the like. Drive signals for exciting the VCSELs in the arrays are controlled by means of the external controller 60. Preferably, the burn-in current through each of the VCSELs in each array is monitored. For example, there may be a monitoring chip 54 that is dedicated to each array 28. The voltage drop across the resistor that is dedicated to a particular VCSEL is monitored. Since there is a direct correlation between the voltage drop and the burn-in current, a feedback signal may be generated by the monitoring chip. This feedback signal provides information to the controller 60 to increase or decrease the current through a particular VCSEL.

After the burn-in step 50 of FIG. 1 has been completed, the individual VCSELs are tested, as indicated at step 68. For example, in FIG. 5 the individual VCSELs can be tested using on-board test circuits 56. Thus, the burn-in step 50 and the test step 68 can be completed without removing the VCSEL arrays 28 from the printed circuit board 52.

As the individual VCSELs of the arrays 28 are tested at step 68, any arrays which are identified as having one or more defective VCSELs are considered defective. At step 70, the defective arrays are marked. The procedure for marking the arrays is not critical. As one possibility, a marking pen is used to identify the defective arrays.

Figure 6:
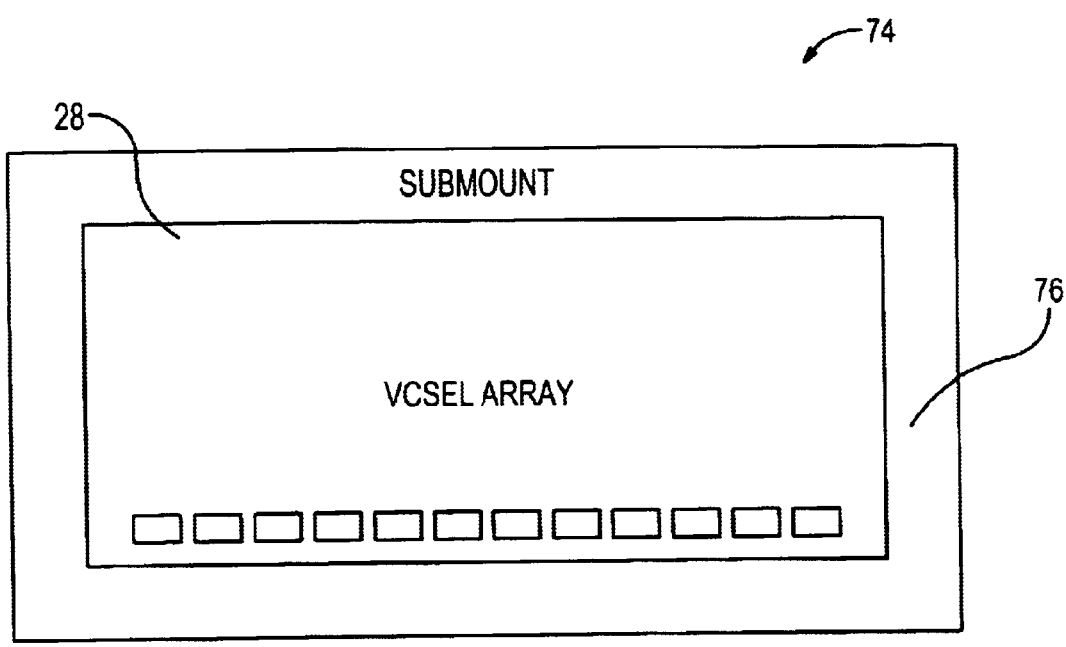
FIG. 6 is a top view of a single mounting-ready assembly after it has been diced from the silicon substrate of FIG. 2.
Figure 7:
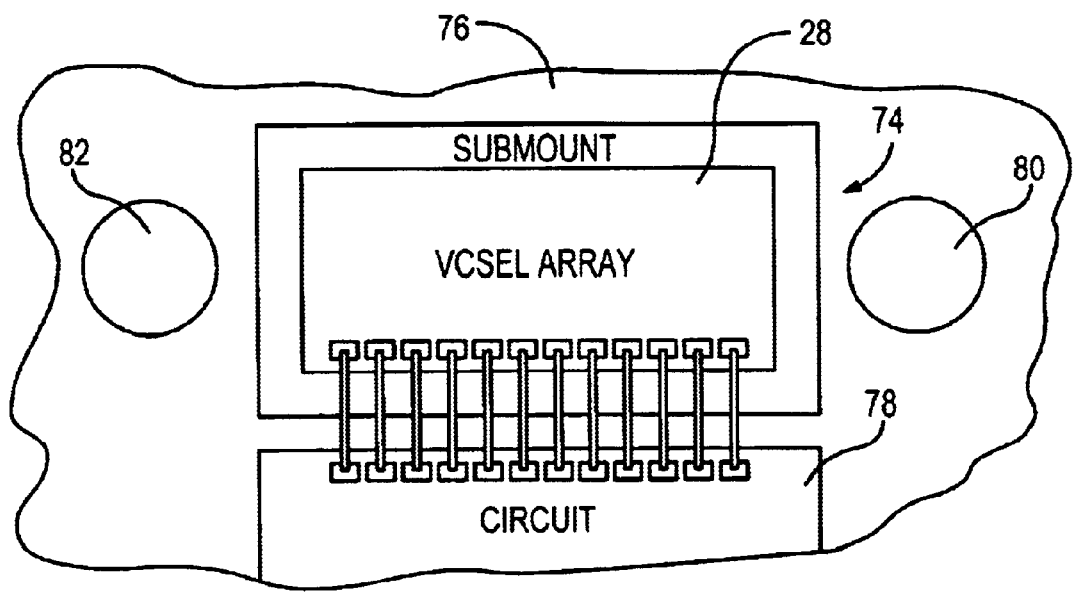
FIG. 7 is top view of the assembly of FIG. 6 following connection into a product.

At step 72, the silicon submount is diced. Specifically, bond wires 40 of FIG. 4 are removed, the peripheral regions of the silicon substrate are removed, and the matrix of VCSEL arrays 28 are individualized. That is, the assembly 74 of FIG. 6 is formed of one of the VOSEL arrays 28 and the segment 76 of the silicon substrate on which the VCSEL array was affixed. Thus, a separate assembly 74 will be formed for each VCSEL array. The assemblies will be substantially identical. At step 75, the arrays which were identified as being defective at step 70 are discarded. The remaining assemblies are used in final packaging at step 77. As an illustration, FIG. 7 shows the assembly 74 of FIG. 6 being mounted within a transmitter module and being connected to a circuit 78 that is used to drive the VCSELs. Guide holes 80 and 82 are formed on opposite sides of the assembly 74. As well known in the art, the guide holes are used in providing alignment of an array of microlenses, where the microlenses are to be axially aligned with the individual VCSELs in the VCSEL array 28.

What is claimed is:

1. A method for use in the manufacturing of devices that utilize arrays of optical transmitters comprising the steps of:
   providing a plurality of said arrays of optical transmitters, including separating said arrays;
   providing a submount substrate having conductive contacts along a side and having electrical paths to said conductive contacts, said conductive contacts including substantially identical contact patterns in which each contact pattern is configured for connection to one of said arrays;
   mounting said arrays of optical transmitters to said submount substrate, including electrically linking said arrays to said contact patterns such that each said optical transmitter in each said array is linked to at least one of said electrical paths;
   performing burn-in processing of said arrays, including:
   1) driving each said optical transmitter of each said array by conducting drive signals through said electrical paths of said submount substrate;
   2) individually monitoring drive signals for a plurality of said optical transmitters; and
   3) selectively adjusting said individually monitored drive signals to approximate preselected burn-in signals for said burn-in processing of said optical transmitters, including varying said individually monitored drive signals for corresponding said optical transmitters on a basis of detecting that said individually monitored drive signals do not approximate said preselected burn-in signals; and
   after completion of said burn-in processing, dicing said submount substrate to provide individualized said arrays on segments of said submount substrate.

2. The method of claim 1 further comprising a step of testing said arrays following said burn-in processing step and before said dicing step, said testing including determining operational states of individual said optical transmitters for each said array.

3. The method of claim 2 further comprising a step of discarding each said array which is detected during said testing step as having a non-operational optical transmitter, said discarding step being executed following said dicing step.

4. The method of claim 1 further comprising a step of using said individualized arrays in the assembly of optical devices, including utilizing contacts on said arrays to electrically connect said optical transmitters to other components of said optical devices.

5. The method of claim 1 wherein each of said steps of providing said arrays and providing said submount substrate include utilizing integrated circuit fabrication techniques, said optical transmitters including a plurality of layers.

6. The method of claim 5 wherein said step of utilizing integrated circuit fabrication techniques includes forming Vertical Cavity Surface Emitting Lasers (VCSELs) as said optical transmitters.

7. The method of claim 5 wherein said step of utilizing integrated circuit fabrication techniques includes forming said submount substrate of a silicon wafer and includes patterning at least one metal layer to define said electrical paths and said conductive contacts.

8. The method of claim 7 wherein said step of utilizing said integrated circuit fabrication techniques further includes integrating resistors onto said submount substrate, with each optical transmitter having at least one said resistor being dedicated thereto, including connecting said at least one resistor to generate a voltage drop that establishes a feedback signal for determining whether to vary said individually monitored drive signals for said corresponding optical transmitters.

9. The method of claim 1 wherein said step of performing said burn-in processing includes conducting drive current through each of said optical transmitters for an extended period of time and at an elevated temperature.

10. The method of claim 1 wherein said step of mounting said arrays to said submount substrate includes utilizing at least one of wire bonding techniques and flip chip techniques.

11. The method of claim 1 wherein said step of performing said burn-in processing includes providing drive current to said optical transmitters via said submount substrate.

12. A method for use in the manufacturing of optical transmitters comprising:

fabricating a plurality of laser diodes on a first substrate;

dicing said first substrate to form a batch of arrays of laser a diodes;

providing a semiconductor substrate having a plurality of electrical paths, each said electrical path being connected to a corresponding said laser diode to conduct an adjustable drive signal for exciting said corresponding laser diode;

mechanically and electrically coupling said arrays to said semiconductor substrate;

performing burn-in testing of said arrays while said arrays are coupled to said semiconductor substrate, including exciting said laser diodes by conducting said adjustable drive signals to said laser diodes of said arrays via said electrical paths on said semiconductor substrate, including adjusting specific ones of said drive signals to maintain a preselected burn-in condition at each of said laser diodes;

dicing said semiconductor substrate based upon positioning of said arrays, thereby forming discrete assemblies of said arrays of said laser diodes on segments of said semiconductor substrate; and electrically connecting said discrete assemblies to other components of said devices being manufactured, including using only those assemblies having said arrays which are tested as being operational following said burn-in testing.

13. The method of claim 12 further comprising a step of fabricating said semiconductor substrate to include bond pads dedicated to coupling to said arrays of laser diodes and to further include bond pads dedicated to coupling to external circuitry for driving and powering said laser diodes.

14. The method of claim 13 wherein said step of fabricating said semiconductor substrate further includes integrating resistors onto said semiconductor substrate, each said laser diode having at least one said resistor dedicated thereto.

15. The method of claim 12 wherein said step of performing said burn-in testing includes elevating the temperature of an environment in which said arrays are contained.

16. The method of claim 12 wherein said step of electrically connecting said discrete assemblies to said other components includes removing said electrical coupling of said arrays to said segments of said semiconductor substrate and further includes forming direct connections from said arrays to said other components.

* * * * *